(12) United States Patent
Johnson

(10) Patent No.: US 6,249,159 B1
(45) Date of Patent: Jun. 19, 2001

(54) FREQUENCY CONTROL CIRCUIT HAVING INCREASED CONTROL BANDWIDTH AT LOWER DEVICE OPERATING SPEED

(75) Inventor: Luke A. Johnson, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/475,010

(22) Filed: Dec. 30, 1999

(51) Int. Cl.[7] ............................................... H03L 7/06
(52) U.S. Cl. ............................................ 327/157; 327/148
(58) Field of Search ................................. 327/156, 157, 327/159, 147, 148, 150; 375/374, 375, 376

(56) References Cited

U.S. PATENT DOCUMENTS

| | | | |
|---|---|---|---|
| 4,596,964 | * 6/1986 | Quaranta | 331/25 |
| 5,491,729 | 2/1996 | Co et al. | 325/376 |

OTHER PUBLICATIONS

Alan Fiedler, et al. "FP15.1: A 1.0625 Gbps Transceiver with 2X–Oversampling and Transmit Signal Pre–Emphasis", 1997 IEEE International Solid–State Circuits Conf. Slide Supplement, (Feb. 1997).

Alan Fiedler, et al. "FP15.1: A 1.0625Gbps Transceiver with 2X Oversampling and Transmit Signal Pre–Emphasis", 1997 IEEE International Solid–State Circuits Conf. Digest of Technical Papers (Feb. 1997).

* cited by examiner

*Primary Examiner*—Toan Tran
*Assistant Examiner*—Linh Nguyen
(74) *Attorney, Agent, or Firm*—Blakely, Sokoloff, Taylor & Zafman LLP

(57) ABSTRACT

According to an embodiment of the invention, an apparatus is disclosed which includes a phasedetector (PD) that is capable of providing a number of first control signals, where each control signal is responsive to a phase error measured at a different time between a first oscillatory signal and one or more second oscillatory signals. The apparatus further includes a capacitor circuit that is coupled to the PD and has a number of charge storage devices. Each charge storage device has a predetermined capacitance. The capacitor circuit is adapted to provide an amount of charge to a filter node in response to a respective one of the first control signals. A voltage of the filter node is filtered and fed to a controllable oscillator. The one or more second oscillatory signals are derived from the output of the oscillator, thus forming a closed loop frequency control circuit. The invention can be applied in a wide range of frequency control circuits, including phase locked loops (PLL), delay locked loops (DLL), and clock and data recovery circuits (CRC).

23 Claims, 7 Drawing Sheets

FREQUENCY CONTROL CIRCUIT HAVING INCREASED CONTROL BANDWIDTH AT LOWER DEVICE OPERATING SPEED

BACKGROUND INFORMATION

This invention is related to frequency control circuits such as phase locked loops (PLLs), delay locked loops (DLLs), and clock recovery circuit (CRC) units.

Frequency control circuits are used in a wide range of applications. For instance, a PLL or DLL may be used to eliminate jitter or skew in a clock signal. A CRC unit locks the phase of a reference clock signal to an input data signal and provides a synchronized data output by sampling the input data signal and synchronizing the sample with the controlled reference clock. In a typical frequency control unit, the phase of an input oscillatory signal is compared to the phase of an output oscillatory signal, and the phase error between these signals is driven to zero using a process that controls the frequency of the output signal and features negative feedback. The term "control bandwidth" refers to the rate at which the process is updated with the most recent phase error information.

At relatively high control bandwidths, it becomes very difficult to ensure that the manufactured version of the frequency control unit can measure the phase error and reliably update the process as designed, particularly when using a low cost integrated circuit (IC) solution that would be more effective at lower frequencies. A limited solution to this problem is to use a parallel phase detector array in which each parallel element measures the phase error at different times and at a lower rate then the "combined" rate of the array as a whole. For instance, if each element of a five-element parallel phase detector is able to measure the phase error at 200 MHz but at a slightly different time, then the detector as a whole is effectively measuring the phase error at five times the rate of each element, or 1 GHz.

In practice, however, the theoretical approach outlined above has not been successful in fully taking advantage of the reduction in the speed of operation of each element of the parallel phase detector array. For instance, in frequency control circuits that use an array of parallel detector elements all of which control the same charge pump (gated current source), the so-called "up" and "down" pulses that are generated by each phase detector element must be active only when that particular element contains the most recent measurement of the phase error to properly control the charge pump. In CRC units, this has translated into the undesirable requirement that the up and down pulses be no wider than the length (from a time point of view) of a "bit cell" in the data signal received by the CRC unit. This means that at least some of the devices which form the integrated circuit CRC unit must operate at the same speed as the control bandwidth of the CRC unit. The disadvantage here is that once the limit of device operating speed has been reached in a frequency control circuit fabricated using a given IC manufacturing process, a different, "faster" manufacturing process must be used to increase the control bandwidth.

SUMMARY

According to an embodiment of the invention, an apparatus is disclosed which includes a phasedetector (PD) that is capable of providing a number of control signals, where each control signal is responsive to a phase error measured at a different time between a first oscillatory signal and a number of second oscillatory signals. The apparatus further includes a capacitor circuit that is coupled to the PD and has a number of charge storage devices. Each charge storage device has a predetermined capacitance. The capacitor circuit is adapted to provide an amount of charge from each of the charge storage devices in response to at least one of the control signals.

BRIEF DESCRIPTION OF THE DRAWINGS

The invention is illustrated by way of example and not by way of limitation in the figures of the accompanying drawings in which like references indicate similar elements. It should be noted that references to "an" embodiment in this disclosure are not necessarily to the same embodiment, and they mean at least one.

DETAILED DESCRIPTION

According to an embodiment of the invention described below, a more effective technique is provided for generating a control signal that is the input to a controllable oscillator of a frequency control circuit. The technique allows increased control bandwidth at lower device operating speed, which allows existing integrated circuit fabrication processes to be used for manufacturing frequency control circuits that are capable of phase locking to an input signal whose frequency is several times higher than the maximum permissible device operating speed in the integrated circuit. For instance, if the rate of input data to a CRC unit built according to an embodiment of the invention is 1 GHz, meaning that one Gbits/sec are received by the circuit, and a number of recovered clock signals are provided by the CRC unit, each one being phase shifted relative to the other and each clock signal having a frequency of approximately 200 MHz, then no device involved with updating the process in the control loop of the CRC unit is required to make a roundtrip transition (e.g. from a logic "0" to logic "1" and back to "0") faster than one half the period of the 200 MHz recovered clock frequency. Thus, a semiconductor IC manufacturing process having a maximum device operating speed of 200 MHz can be used to manufacture a CRC unit that predictably recovers five, parallel, phase shifted clock signals from a 1 GHz input. Such parallel clock signals may then be used to synchronize samples of the input data signal to yield five 200 MHz data signals. This, of course, is only an example and the invention may be used with a wide range of frequencies and is not limited to any particular ratio of recovered clock frequency to the input data rate.

Figure 1:
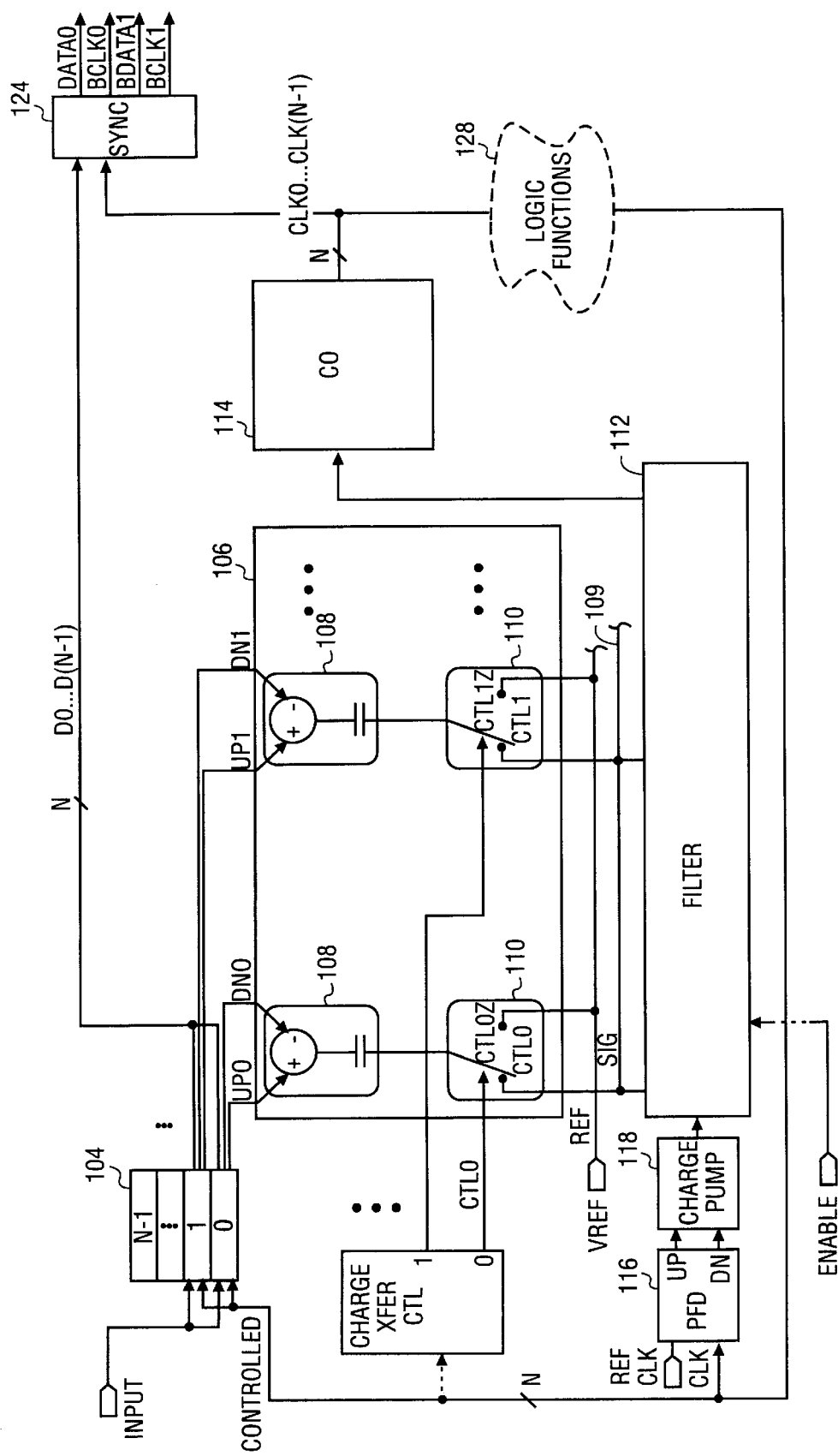
FIG. 1 illustrates an embodiment of the invention as a part of a clock recovery circuit.

FIG. 1 illustrates a block diagram of a frequency control circuit according to an embodiment of the invention. The frequency control circuit is part of a CRC unit that features a phase detector 104 (PD 104) that is capable of providing a number of control signals UP and DN, where each control signal is responsive to a phase error measured at different times between a first oscillatory signal, labeled INPUT, and one or more oscillatory signals labeled CONTROLLED. In the particular embodiment shown in FIG. 1, the PD 104 is made up of a number of parallel detector elements labeled 0, 1, . . . Each such detector element is capable of capturing the INPUT signal responsive to a respective one of the one or more CONTROLLED signals. There are N CONTROLLED signals, where N is a positive integer greater than or equal to one. As part of a CRC unit, the PD 104 also samples N values of the INPUT signal to represent a number of bits labeled D0, D1, . . . D(N−1) in FIG. 1. The rate at which the INPUT signal is sampled may be determined by the frequency of the edges of the CONTROLLED inputs to the PD 104. In a particular embodiment, this frequency is twice the fundamental bit rate in the INPUT signal. Accordingly, in this embodiment of the CRC unit, there should be some means for obtaining an oscillatory signal whose frequency is approximately the same as that of the fundamental bit rate divided by N. This may be done by feeding the CRC unit a separate clock signal, or including a reference clock generator as part of the CRC unit.

The circuit of FIG. 1 also includes a capacitor circuit which is coupled to the PD 104 to receive the UP and DN control signals. In a particular embodiment of the invention, the PD 104 is a so-called "bang-bang" detector, and the first control signals are arranged as pairs of at least one UP component and at least one DOWN component, generated by each respective detector element. Each pair of these control signals is fed to a respective charge storage device 108 that has a predetermined capacitance. The charge storage device 108 provides an amount of charge, proportional to the predetermined capacitance, in response to an UP signal. This amount of charge is provided to a signal (SIG) node shared by all charge storage devices in the capacitor circuit. In addition, each charge storage device can accept an amount of charge, in response to the DOWN signal, from the SIG node. For instance, when the DN0 signal is asserted, its transition is applied to a capacitor inside the charge storage device 108, such that there is a net increase in the charge stored in the capacitor. The excess charge was transferred from the SIG node, which results in a decrease in the voltage of the SIG node.

The voltage on the SIG node is buffered to generate a reference (REF) node voltage. The amount of charge (positive or negative) transferred to the SIG node from the charge storage device 108 was obtained from the REF node when the UP or DOWN signal (DN0 for example) was previously deasserted. The required conductive paths between the charge storage device 108 and the REF and SIG nodes may be accomplished using various types of charge transfer circuitry 110, including one that operates as a switch which is represented as a single pole double throw version in FIG. 1. There are N charge transfer control signals labeled CTL0, CTL1, . . . provided by a charge transfer control block 120. In a particular embodiment of the invention in which the INPUT signal is a synchronous data signal or clock signal, the charge transfer control signals may have the same frequency as the clock signals CLK 0 . . . CLK (N−1) generated by a controlled oscillator (CO) 114, and are phase shifted with respect to controlled clock signals CLK0 . . . CLK(N−1). The amount of the phase shift can vary over a wide range, so long as the phase shifts allow the proper setup times for the logic devices inside the PD 104. The job of the control signals is to connect the charge storage device 108 to the REF signal while the UP and DOWN signals are deasserted and connect it to the SIG signal while they are asserted. This will become more apparent when an example of the PD 104 is described in FIG. 2 below.

The PD 104 and the capacitor circuit 106 cooperate to adjust the voltage level on the SIG node, using the REF node to extract or dump charge, as commanded by the UP and DOWN signals and as governed by the charge transfer control signals CTL0, CTL1, The SIG node feeds into a filter 112 that provides a low pass filtering function to smooth out the adjustments being made to the SIG node. A wide range of actual filter designs as known to those of ordinary skill in the art can be used to provide the required filter function. In response to filtering the voltage on the SIG node, the filter 112 provides an output to the CO 114, such as a voltage or current. The filter output node may be separate from the filter input (SIG node) as shown in FIG. 1, or it may be the same, depending upon the type of filter used. The CO 114 in turn adjusts the frequency of one or more clock signals CLK0 . . . CLK(N−1) in proportion to a voltage or current provided by the filter 112. The clock signals provided by the CO 114 are then fed back to the PFD 104 to close the control loop of the frequency control circuit.

It should be recognized that the CONTROLLED signals input to the PD 104 need not be the immediate output of the CO 114. The CONTROLLED signals at the input of the PFD 104 may instead originate from a logic functional block 128 that may not be a part of the frequency control circuit but which nevertheless uses the clock signals from the output of the CO 114 to perform certain logic functions including those in a system application such as a computer motherboard. In this manner, the frequency control circuit of FIG. 1 may also operate to correct any skew or jitter in the clock signals that may be caused by the logic functional block 128.

As part of a CRC unit, the frequency control circuit of FIG. 1 may further include a PLL circuit that is capable of phase locking the clock signals CLK0 . . . CLK(N−1) to an output REF CLK of a reference clock generator (not shown). This may be done according to a wide range of techniques, where the PLL selectively phase locks the clock signals depending upon whether a CRCL_ENABLE signal is asserted or not. In the embodiment shown in FIG. 1, this enable signal is fed into the filter 112 in which circuitry (not shown) determines whether the output of the filter 112 which feeds into the CO 114 is controlled by (1) the PD 104 and capacitor circuit 106 combination, or (2) the combination of a phase-frequency detector (PFD) 116 and charge pump 118. The PFD 116 repeatedly updates its own pair of UP/DOWN signals which instruct the charge pump 118 to pump the voltage on the SIG node up or down in accordance with the phase error measured between one of the CONTROLLED inputs to the PD 104 (or the clock signals CLK0 . . . CLK(N−1)) and the reference clock signal REF CLK. The frequency of REF CLK may be controlled by a crystal oscillator and may be equal to the bit rate in the INPUT signal. This PLL circuitry is needed, in addition to the PD 104 and capacitor circuit 106 combination, for CRC units because of the generally random frequency of the transitions in the INPUT signal which carries data, such as non-return-to-zero ("NRZ") data. If the additional PLL circuitry is not provided, then the CO 114 might lock to a harmonic other than the fundamental bit rate of the INPUT signal. The additional PLL circuitry may be selectively controlled by the enable signal, CRC_ENABLE, to be enabled upon startup but then is soon disabled after the output of the CO 114 has locked to the fundamental bit rate (as represented by a frequency of REF CLK). Thereafter, the PLL circuitry may again be enabled as needed to ensure that the output of the CO 114 remains locked to the fundamental bit rate despite the random nature of data transitions in the INPUT signal. As mentioned above, there may be a wide range of alternative designs known to those of ordinary skill in the art for the additional PLL circuitry needed in the CRC embodiment, including the use of a detector other than a PFD, but in the interest of conciseness not all of them have been described here.

To further help avoid having the output of the CO 114 from locking to a frequency other than the fundamental bit rate, the data in the INPUT signal may be encoded such that a minimum rate of transitions in INPUT is guaranteed, regardless of the true data content being delivered. In this way, the input to the CO 114 may be limited in the amount it is able to drift somewhat while there are no transitions in the INPUT signal As a CRC unit, the frequency control circuit shown in FIG. 1 would also include a means for synchronizing the data signals D0, D1, . . . D(N−1) from the PD 104 with the one or more clock signals generated by the CO 114. Thus, in FIG. 1, a sync block 124 provides N data signals DATA0, DATA1, . . . DATA(N−1) whose active pulses are synchronized with the edges of their respective clock signals CLK0, CLK1, . . . CLK(N−1). A corresponding number of buffered clock signals BCLK0 . . . BCLK(N−1) are also provided to form pairs of recovered data and clock signals. The sync block 124 could also line up the data to be synchronous with one clock so it may be fed in a parallel manner out of the CRC unit. In general, a wide range of synchronizing circuits known to those of ordinary skill in the art may be used in the sync block 124, including simple AND logic, to synchronize the individual data and corresponding clock signal pairs.

Figure 2A:
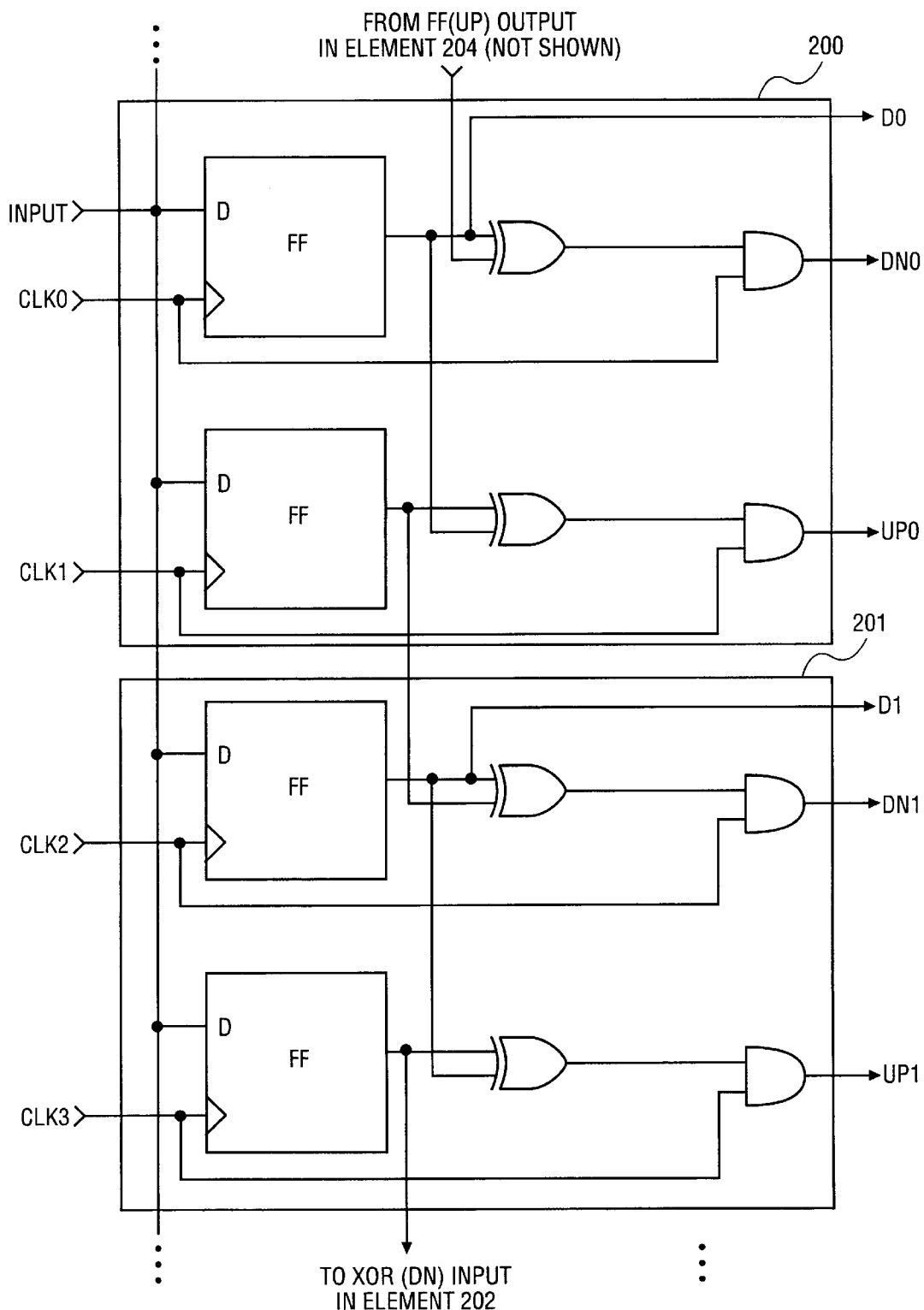
FIGS. 2A and 2B are logic schematics of part of a parallel PD that can be used in an embodiment of the invention.
Figure 2B:
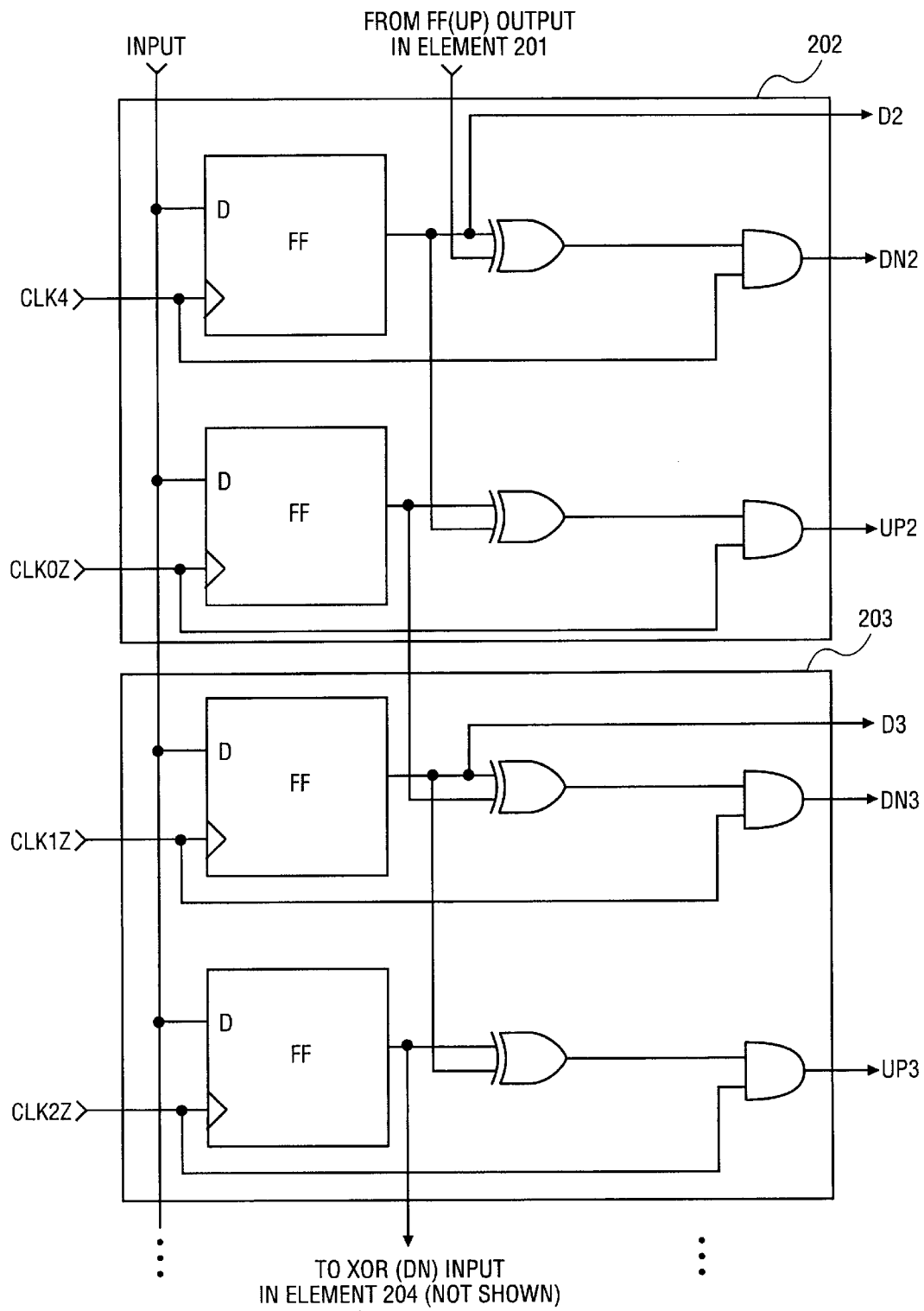
Figure 3:
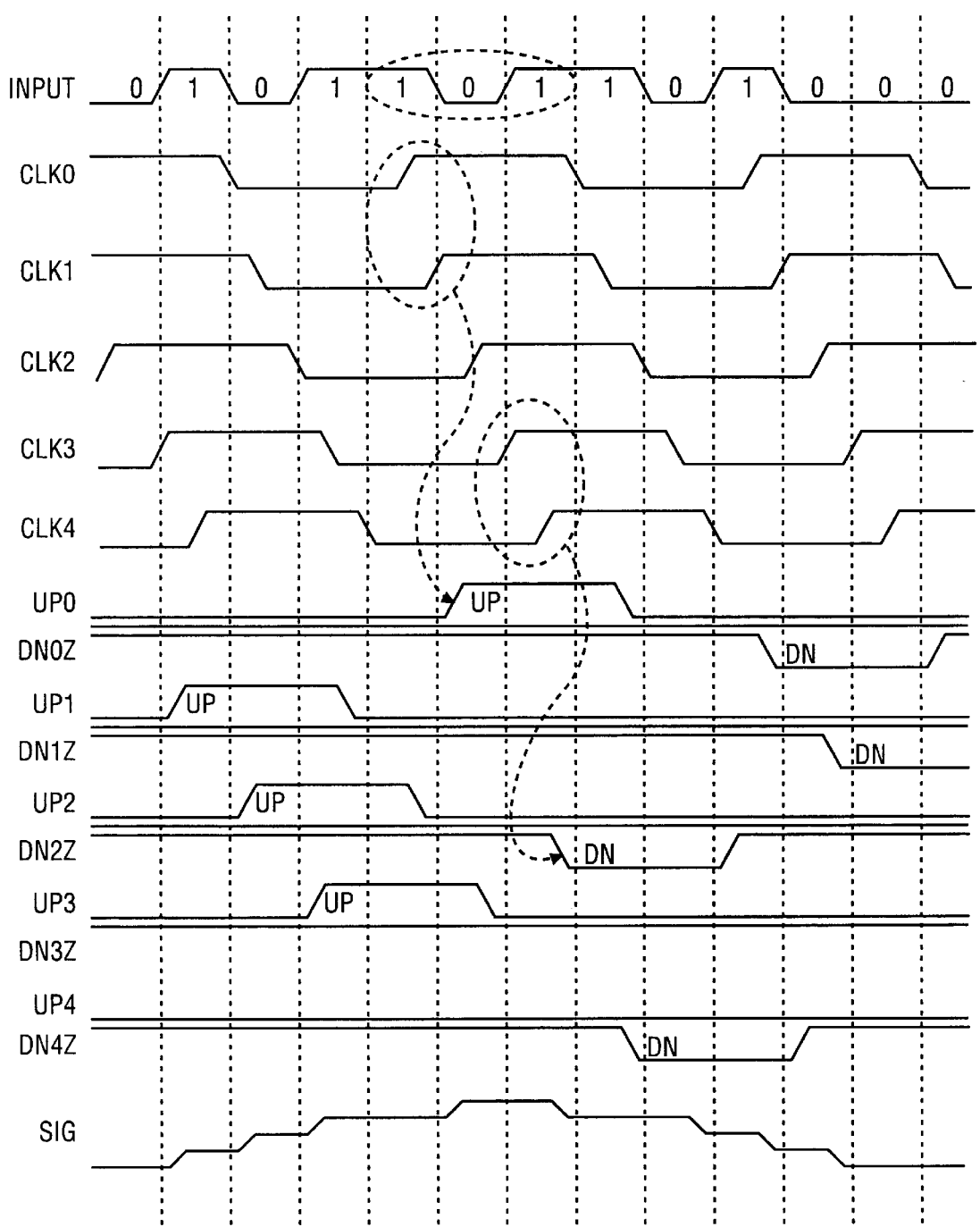
FIG. 3 shows the timing diagram of control signals provided by a parallel phasedetector, clock signals that are provided to the detector, as well as an approximation of a filtered charge signal.

Having described an embodiment of the invention as a frequency control circuit that uses a phase detector (PD 104) in combination with a capacitor circuit 106 to update the input to a controlled oscillator, FIGS. 2A and 2B take a closer look at a particular implementation of the PD 104 and an associated timing diagram in FIG. 3. There are a number of identical detector elements, in this case labeled 200, 201, 202 and 203, which provide a measure of the phase error between the INPUT signal and a number of other oscillatory signals. These other oscillatory signals are derived from the output of the CO 114 (see FIG. 1 momentarily) and are indicated, for a particular embodiment, as being the same as the CLK0 . . . CLK4 signals. Each detector element has a pair of D flip-flop, XOR gate, and AND gate subcircuits which are connected as shown to sample the INPUT signal by the D flip-flop. In detector element 200, the DOWN signal (DN0) is asserted if there was a transition in the INPUT signal between consecutive transitions of CLK4 and CLK0, where the rising edge of CLK4 leads the next rising edge of CLK0, as seen in the timing diagram of FIG. 3. As to the UP0 signal, this signal is asserted when there has been a transition in the INPUT signal between consecutive transitions of CLK0 and CLK1, where the rising edge of CLK0 leads the next rising edge of CLK1. Similarly, for element 201, the DOWN signal DN1 is asserted when there is a transition in the INPUT signal between consecutive transitions of CLK1 and CLK2.

In FIG. 3, the INPUT signal consists of a serial bit stream of data. The INPUT signal as well as the UP and DOWN control signals are digital signals having two substantially time-invariant states. The clock signals CLK0 . . . CLK4 are of the same frequency but are time shifted with respect to each other such that they are in a phase relationship in which the edges are equally spaced throughout one period. Note that the DOWN signals shown in FIG. 3 are DN0z, DN1z, . . . DN4z which are the complements of DN0, DN1 . . . DN4 shown in FIG. 2A and 2B.

It can be seen that UP0 is asserted while CLK0 is high because of a transition in the INPUT signal that occurred between consecutive transitions (low to high) of CLK0 and CLK1. For instance, taking the sequence of 1-0-1 in approximately the center of the bit stream of the INPUT signal, it can be seen that when CLK0 transitions from a low to high, the INPUT signal is at a logic "1". But when the next low to high transition arrives at the PD 104, namely that of CLK1, the INPUT signal has just changed to logic state "0". This transition in the INPUT signal between consecutive edges of CLK0 and CLK1 results in UP0 being asserted, indicating that the phase of the CONTROLLED signal lags that of the INPUT signal. Note that UP0 will be deasserted when CLK1 is deasserted.

The next low to high transition following CLK1 is CLK2. When CLK2 transitions from low to high, the INPUT signal is still at its logic "0" state. following the low to high transition of CLK2, CLK3 rises. In the example shown in FIG. 3, it is assumed that CLK3 transitioned from low to high just before the input switched to the logic state "1". Therefore, CLK3 causes a logic state "0" to be sampled. When CLK4 transitions from low to high, a logic "1" is sampled. At this point, the circuitry determines that the INPUT changed after CLK3 and before CLK4 and DN2Z is asserted. The rest of the UP and DOWN signals are generated similarly using different edges of the five clocks. Note that the clock signals CLK0 . . . CLK4 are the fastest, i.e. the most frequently transitioning, signals in FIG. 3, and consecutive UP and DOWN assertions by the PD 104 as a whole can occur at five times the frequency of the clock signals. This is because there are five time shifted clock signals being applied to the phase frequency detector logic shown in FIG. 2A and 2B. In general, there may be fewer or greater than five clock signals which are being used, corresponding to the same number of parallel detector elements. Increasing the number of detector elements and the number of clock signals increases the rate at which the consecutive UP and DOWN assertions are generated, provided that the setup requirement times for the flip-flops in the detector elements are met. Alternatively, the rate at which consecutive UP and DOWN signals are updated may be increased by keeping the number of clock signals and detector elements fixed, but increasing the frequency of the clock signals. Of course, an increase in the frequency of the clock signals will require greater minimum device operating speed in the IC implementation of the frequency control circuit. Accordingly, it may be desirable to add additional clock signals and detector elements, once the clock frequency reaches a relatively high level in comparison with the maximum device operating speed, to allow higher frequencies/bit rates in the INPUT signal.

In prior art designs, the UP and DOWN signals generated above are further qualified (i.e. ANDed) by the clock signals to prevent overlapping. For example, UP0 above would be ANDed with CLK3z to ensure it is deasserted before UP1 can be asserted. These pulses are then fed into a traditional charge pump (gated current source). The timing of these signals is critical in the prior art design. They must assert themselves, turn on a current source to add or subtract charge from the SIG node, and then turn off in the short time it takes to receive a single bit. This is very difficult to do with predictable results. In the prior art design, it is important that the UP and DOWN charges delivered or taken from the SIG node be matched else phase lock will be very tenuous, if not impossible. With high-speed pulses, this is very challenging to accomplish. The capacitor circuit used in an embodiment of this invention removes the need to generate such small pulses. Instead of turning on a current source for the duration of the (short) pulse as is done traditionally, the charge is transferred on the transition of the UP or DOWN pulse. In this way the desired charge is transferred before the next UP or DOWN signal becomes valid, and no further qualification of the UP and DOWN signals is required. Furthermore, the amount of charge is not dependent on the edge rate or the pule width. It is easy to match the UP and DOWN charges using the invention's capacitor circuit, as described in the example below.

With the timing diagram of FIG. 3 in mind, the operation of the capacitor circuit 106 of FIG. 1, according to one embodiment of the invention, may be appreciated based on the following example. If CTL0 is the same as CLK0, and CTL1 is CLK1, and so on, then the following scenario unfolds. When CLK0 is asserted during the first part of the 1-0-1 sequence in the middle of the bit stream in the INPUT signal, there is a conductive path created between the SIG node and the charge storage device 108. When CLK0 is deasserted, the conductive path is between the charge storage device 108 and the REF node. Thus, when CLK0 is deasserted, the charge storage device 108 is charged to a voltage VREF-VLO where VLO is the logic "0" state of the UP0 signal received from the PD 104. When CLK0 is thereafter asserted, the voltage across the capacitor in the charge storage device 108 becomes VSIG-VLO. If VSIG and VREF are kept essentially equal to each other, by for instance using a unity gain buffer between the SIG and REF nodes, then there is no appreciable reduction or increase in the amount of charge stored in the charge storage device 108 when CLK0 transitions.

After CLK0 has been asserted, it is possible that the UP0 signal may be asserted, depending on the phase error measured by the element 200 of the PD 104 (see FIG. 2A). If that is the case, then UP0 will transition from VLO to VHI which results in a reduction in the charge stored in the capacitor of storage device 108. This amount of charge taken out of the charge storage device 108 is transferred to the SIG node through the conductive path that was created by the assertion of CLK0. This reduction in charge occurs entirely during the transition of the UP0 signal.

The amount of charge transferred to the SIG node may be accurately predicted because the capacitor in the charge storage device 108 has a predetermined capacitance, the SIG node has a predetermined capacitance, and the voltage levels VLO and VHI can also be predicted fairly reliably and kept constant using most modern semiconductor IC manufacturing processes. This allows the capacitor circuit 106 to be designed in such a way that each transition of an UP or DOWN signal will result in a deterministic change in the voltage of the SIG node. The effect is to step the voltage on the SIG node up and down as shown in the example of FIG. 3.

To complete the cycle after CLK0 has been asserted, CLK0 is deasserted before UP0 is deasserted. This ensures that the charge added to SIG stays on the SIG node. The charge storage device, then, replenishes its charge from the REF node. The change in voltage on the SIG node, together with the rate at which the UP and DOWN signals are generated, can be used to design a frequency control circuit, such as that shown in FIGS. 1, 2A, and 2B, that is capable of locking to the INPUT signal using devices which operate at much lower frequencies than the frequency/bit rate of the INPUT signal.

Although in the above-described embodiment the signals which control the conductive paths between the REF and SIG nodes and the charge storage devices are essentially the same as the clock signals CLK0 . . . CLK(N−1), the invention is not limited to such particular embodiment. It is not necessary that the charge transfer control signals which control the conductive paths in the capacitor circuit 106 be strictly periodic. In general, if the conductive path between the charge storage device 108 and the SIG node is established prior to the corresponding UP/DOWN signal assertion, and is removed and replaced with a connection to the REF signal before the UP/DOWN signal from the PD 104 deasserts, then the capacitor circuit 106 should be able to accurately update the voltage on the SIG node while maintaining a phase lock on the INPUT signal. The charge transfer control signals may actually display some jitter without affecting proper operation of the control looplt should be noted that although the operation of the frequency control circuit 106 featuring the capacitor circuit of FIG. 1 has been described in conjunction with the PD 104 in FIGS. 2A and 2B and the timing diagram of FIG. 3, in which the UP and DOWN signals as well as the CLK0 . . . CLK4 signals were described as being several times slower than the bit rate or frequency of the INPUT signal, a "faster" timing, i.e. one in which the UP and DOWN pulses are narrower than those shown in FIG. 3, can alternatively be used to properly operate the capacitor circuit 106. However, such narrower pulses are not necessary to properly operate the capacitor circuit 106 so as to lock to the data bit rate or the fundamental frequency of the INPUT signal. The phase lock may be obtained using a slower timing such as that shown in FIG. 3, which subjects the constituent IC devices in the PD 104 and the capacitor circuit 106 to much lower effective operating frequencies.

Figure 4:
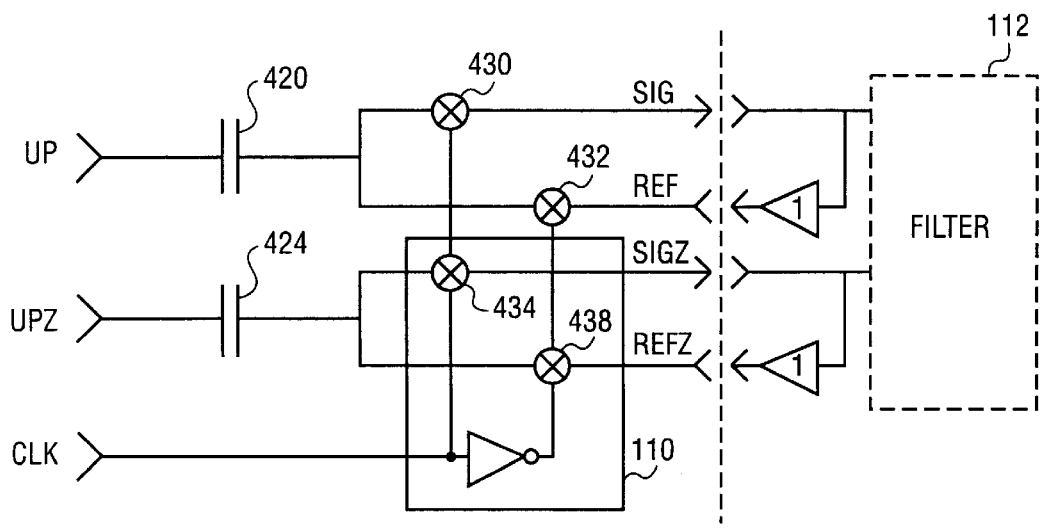
FIG. 4 illustrates a capacitor circuit and filter combination according to an embodiment of the invention.

FIG. 4 illustrates a portion of a capacitor circuit 106 and filter 112 combination according to an embodiment of the invention. This embodiment is based on the use of a differential signal path between each element of the PD 104 and the filter 112. Each element in the PD 104 provides, in this embodiment, a differential pair of UP and UPz signals and a differential pair of DN and DNz signals. The SIG and REF nodes are also differential, made up of nodes SIG and SIGz and REF and REFz. Thus, when it is desired to increase the level on the SIG node, the level of the SIGz node is correspondingly decreased. The same mechanism also applies to the REF and the REFz nodes which are connected to the output of unity gain buffers that buffer the voltages on the SIG and SIGz nodes, respectively.

In the embodiment of FIG. 4, only the UP portion of a channel in the capacitor circuit 106 is shown, having a pair of capacitors 420 and 424 each of which receives a respective one of the UP and UPz control signals from the PFD 104. A number of transfer gates 430, 432, 434, and 438 are coupled between the capacitors 420 and 424 and the SIG and REF nodes as shown. The transfer gates 430 and 434 receive a respective one of the charge transfer control signals from the charge transfer control block 120, the control signal in this case being the same as one of the CLK0 . . . CLK(N−1) from the output of the CO 114. It can be seen that when CLK is asserted in FIG. 4, gates 430 and 434 conduct such that a subsequent low to high transition in UP (corresponding to a complimentary high to low transition in UPz) will dump charge from the capacitor 420 into the SIG node and extract charge from the SIGz node, to increase the differential voltage between these nodes. Thereafter, when CLK is deasserted, transfer gates 430 and 434 do not conduct and essentially isolate SIG and SIGz from the capacitors 420 and 424, whereas transfer gates 432 and 438 now conduct. These capacitors are now ready for the deasserting (high to low) transition in UP at which point they will restore their charge from the REF node. The circuit is now ready for the cycle to repeat to again increase the level on the SIG node when the PD 104 determines it necessary.

Figure 5:
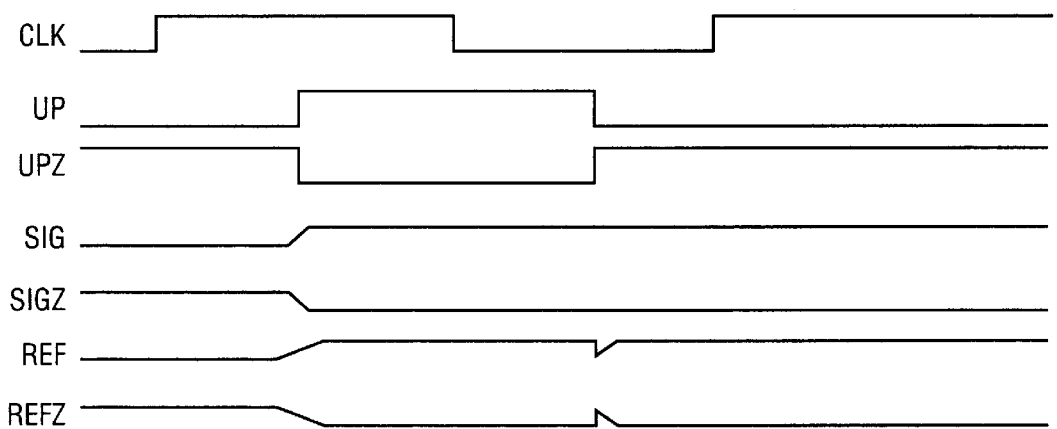
FIG. 5 is a timing diagram of signals related to the capacitor circuit and filter combination of FIG. 4.

An exemplary timing diagram for operating the portion of the capacitor circuit 106 shown in FIG. 4 is shown in FIG. 5. The timing diagram illustrates the effect on the SIG and SIGz signals (and the corresponding effect on the REF and REFz signals) when the UP and UPz signals transition while CLK is asserted. The effect of the high to low transition in UP (and corresponding low to high transition in Upz) on REF and REFz is shown as a "blip" during which the capacitors 420 and 424 are recharged in preparation for the next low to high transition of UP (and corresponding high to low transition of Upz). It will be appreciated that an essentially identical circuit configuration and timing diagram as in FIGS. 4 and 5 can be duplicated for the DOWN channel in the capacitor circuit 106, except of course that the phase of the CLK signal to control the transfer gates of the down channel will be different than that of the CLK signal in FIG. 5.

Figure 6:
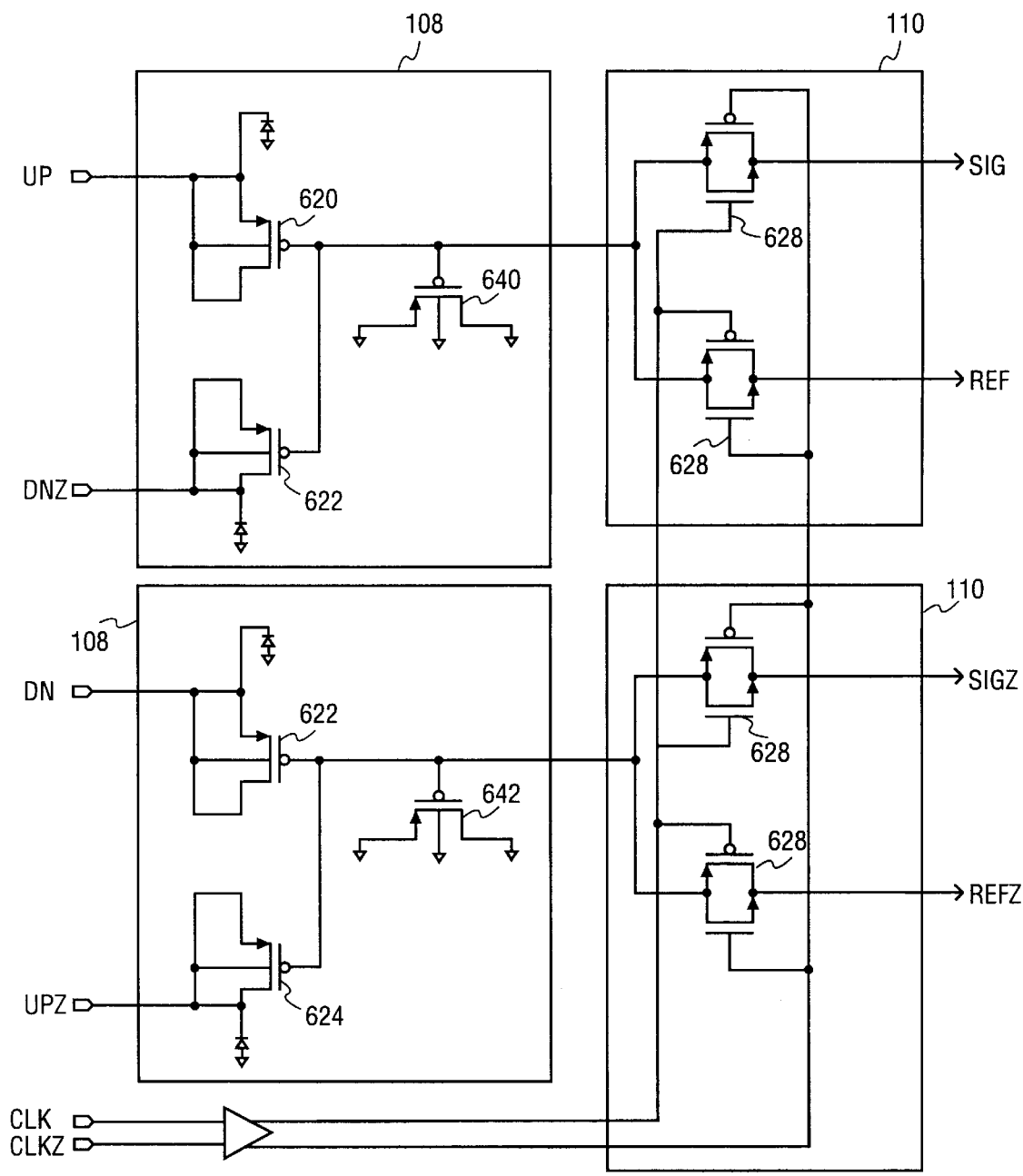
FIG. 6 shows a particular implementation of the capacitor circuit according to an embodiment of the invention that uses MOS devices.

FIG. 6 illustrates a single channel of the capacitor circuit 106 configured for differential control of the SIG and SIGz nodes. The UP and DOWN control signals are in differential format, where the PD 104 generates UP and UPz and DN and DNz. For the particular embodiment of the invention shown in FIG. 6, there are two charge storage devices 108 (refer momentarily to FIG. 1), one receiving the UP and DNz control signals while the other receives the DN and UPz signals. The complementary metal oxide semiconductor (CMOS) implementation in FIG. 6 features capacitors 620 and 604 based upon P-channel field effect transistor (FET) structures. The capacitance of the devices 620 and 624 needed to store the proper amount of charge may be determined at the design stage using computer aided circuit design and simulation tools. The capacitance presented by devices 620 and 624 should be equal, so that the same amount of charge can be transferred to the SIG node and removed from the SIGz node in response to the UP and UPz signal being asserted. Similarly, the capacitances presented by the devices 622 and 626 should also be equal so that the same amount of charge is transferred out of the SIG node and on to the SIGz node in response to the DN and DNz signals being asserted. In addition, if it is desired to equalize the change in the voltage of the SIG node in the up direction and the down direction, the capacitances presented by devices 620 and 622 (and similarly for devices 626 and 624) should be equal.

In the embodiment of FIG. 6, the charge transfer to and from the SIG and REF nodes occurs through a number of CMOS switches 628. The CMOS switch 628 is controlled by a complimentary pair of signals derived from a differential CLK/CLKz pair. When CLK is asserted, conductive paths are created to the SIG and SIGz nodes, whereas when CLK is deasserted the SIG and SIGz paths are blocked and the REF and REFz paths are conducting, which is consistent with the more general scenario of the charge transfer circuit 110, as the single pole double throw switch shown in FIG. 1 and as the four transfer gates in FIG. 4.

As mentioned earlier, the amount of charge that is placed onto and removed from the SIG and REF nodes by the capacitor circuit 106 may be predetermined based on a number of factors, including controlling at the design stage the capacitance of the devices 620 . . . 626 as well as by selecting the low to high voltage swing on the UP and DOWN control signals received from the PD 104. An additional technique for controlling the amount of charge is to bypass some of the charge that is transferred to and from the SIG and REF nodes to and from a power supply node. As seen in FIG. 6, this charge bypass may be accomplished using shunt capacitor devices 640 and 642. For instance, device 640 reduces the amount of charge that is transferred to the SIG node when UP is asserted by shunting some of the charge coming from the device 620 into power supply ground rather than into the SIG node. A similar effect is achieved by the device 642 when the DN signal is asserted to increase the level on the SIGz node. These additional capacitor devices 640 and 642 thus serve to allow finer control of the voltage on the SIG and REF nodes.

Figure 7:
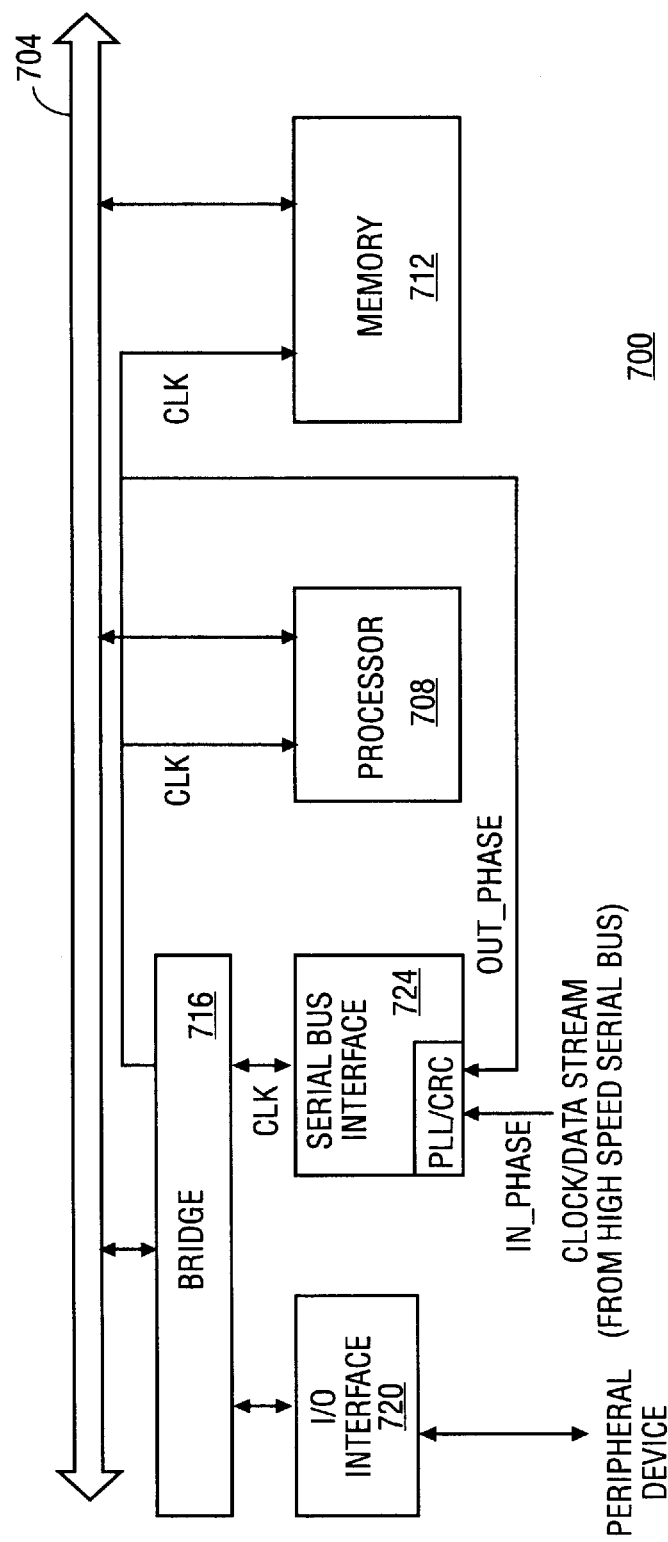
FIG. 7 illustrates an electronic system configured with a frequency control circuit according to an embodiment of the invention.

The frequency control circuits described above can be used in a number of different system applications, one of which is illustrated in FIG. 7. The electronic system 700 in FIG. 7 can be part of a motherboard in a personal computer (PC), or it may be part of an embedded processor application. A system bus 704 can be accessed by a number of bus devices, including a processor 708, a memory 712, and a bridge 716. The bridge 716 allows one of a number of bus devices to access the system bus 704 according to a priority scheme. Among the bus devices there is an I/O interface 720 and a serial bus interface 724. The serial bus interface 724 delivers data from a serial bus to the system bus 704. In addition, the serial bus interface 724 recovers a number of pairs of data and clock signals from a bitstream received via the serial bus. This is done by a phase locked loop/clock recovery circuit ("PLL/CRC"), such as the one illustrated in FIG. 1, that is equipped with the capacitor circuit 106 according to one of the various embodiments of the invention. The serial bus interface 724 accesses the system bus 704 via the bridge 716 to deliver the recovered data and clock signals to the system bus 704.

A clock or data stream provides the in_phase information to a PFD in the PLL/CRC of the serial bus interface, while the out_phase information may be derived from a location on the motherboard that is near the processor 708 and the memory 712. The PLL/CRC in the serial bus interface 724 may operate according to the feedback control circuit of FIG. 1 to provide a controlled clock signal ("CLK") that is fed to the bridge 716 and then distributed to other bus devices including the processor 708 and the memory 712. As discussed with reference to FIG. 1, use of the capacitor circuit 106 for updating the input level of the CO in the PLL/CRC will permit greater frequency control bandwidth with lower device operating speed.

To summarize, various embodiments of the invention have been described that are directed to an improved frequency control circuit design that permits greater control bandwidth at lower device operating speed. In the foregoing specification, the invention has been described with reference to specific exemplary embodiments thereof. It will, however, be evident that various modifications and changes may be made thereto without departing from the broader spirit and scope of the invention as set forth in the appended claims. For instance, the capacitor circuit, PD, and filter combination shown in FIG. 1 may be used in a PLL or DLL to lock the output of the CO to an input clock signal, rather than to an input data signal which is provided to a CRC unit. The specification and drawings are, accordingly, to be regarded in an illustrative rather than a restrictive sense.

What is claimed is:

1. An apparatus comprising:
    a phase detector (PD) capable of providing a plurality of first control signals each being responsive to a phase error measured at a different time between a first oscillatory signal and a plurality of second oscillatory signals; and a capacitor circuit coupled to the PD and having a plurality of charge storage devices, each charge storage device having a predetermined capacitance, the capacitor circuit being adapted to provide an amount of charge from each of the charge storage devices in response to at least one of the plurality of first control signals.

2. The apparatus of claim 1 wherein the second oscillatory signals have substantially the same frequency, are phase shifted with respect to each other and correspond to an equal number of a plurality of parallel detector elements in the PD, each detector element being capable of capturing the first oscillatory signal responsive to a respective one of the second oscillatory signals.

3. The apparatus of claim 2 wherein the plurality of first control signals include pairs of signals, each pair having at least one up component and at least one down component generated by a respective one of the plurality of parallel detector elements in response to a measure of the phase error.

4. The apparatus of claim 1 wherein the amount of charge is switched in response to the at least one of the plurality of first control signals.

5. The apparatus of claim 1 wherein the plurality of first control signals are digital signals each having two substantially time-invariant states, and wherein the amount of charge is entirely provided during a transition of a respective one of the plurality of first control signals.

6. The apparatus of claim 1 further comprising a filter capable of providing a third control signal in response to filtering a filter input signal representing the amount of charge provided by the capacitor circuit; and a controllable oscillator capable of providing an oscillator output signal whose frequency varies in proportion to the third control signal.

7. The apparatus of claim 6 wherein the filter has a filter input node coupled to receive the amount of charge, the filter input signal being a voltage of the filter input node.

8. The apparatus of claim 3 wherein the capacitor circuit includes a plurality of transfer gates each coupled between a first end of a respective one of the plurality of charge storage devices and the filter input node, and wherein a second end of each of the plurality of charge storage devices is coupled to receive a respective one of the plurality of first control signals, each of the plurality of transfer gates to receive a respective one of a plurality of fourth control signals to control signal transfer through each gate.

9. The apparatus of claim 8 wherein each of the plurality of fourth control signals is a respective one of the one or more second oscillatory signals.

10. The apparatus of claim 1 wherein the first oscillatory signal is a periodic clock signal.

11. The apparatus of claim 6 further comprising:

a reference clock generator; and a phase locked loop circuit capable of phase locking the oscillator output signal to an output of the clock generator.

12. The apparatus of claim 11 further comprising:

clock-data synchronizing logic having one input coupled to an output of the controllable oscillator and another input coupled to a further output of the PD which provides samples of the first oscillatory signal in response to one of the second oscillatory signals.

13. An apparatus comprising:

means for providing a plurality of first control signals, each being responsive to a phase error measured at a different time between a first oscillatory signal and a plurality of second oscillatory signals; and means for at least one of charging and discharging a node using a plurality of charge storage devices, each having a predetermined capacitance, in response to the plurality of first control signals.

14. The apparatus of claim 13 wherein the plurality of first control signals include a plurality of pairs of digital signals, each pair having at least one up component and at least one down component, the charging means charges the node in response to the at least one up component being asserted and the discharging means discharges the node in response to the at least one down component being asserted.

15. The apparatus of claim 13 further comprising:

means for filtering a voltage on the node; and means for generating one or more oscillatory signals whose frequencies vary in proportion to the filtered voltage.

16. The apparatus of claim 15 further comprising:

means for generating a reference oscillatory signal;

means for selectively phase locking the one or more oscillatory signals to the reference oscillatory signal; and means for synchronizing samples of the first oscillatory signal with the one or more oscillatory signals.

17. An electronic system comprising:

a system bus capable of allowing communication between a processor and memory; and an interface circuit coupled between the system bus and a transmission line, the interface circuit having a phase detector (PD) capable of providing a plurality of first control signals each being responsive to a phase error measured at a different time between a first oscillatory signal received from the transmission line and a plurality of second oscillatory signals derived from the electronic system, and a capacitor circuit coupled to the PD and having a plurality of charge storage devices, each device having a predetermined capacitance, the capacitor circuit being adapted to provide an amount of charge from each of the charge storage devices in response to at least one of the plurality of first control signals.

18. The electronic system of claim 17 wherein the first oscillatory signal is a Non Return to Zero (NRZ) data signal.

19. The electronic system of claim 17 wherein the interface circuit further comprises:

a filter capable of providing a third control signal in response to filtering a filter input signal representing the plurality of amounts of charge provided by the capacitor circuit; and a controllable oscillator capable of providing an oscillator output signal whose frequency varies in proportion to the third control signal.

20. The electronic system of claim 19 wherein the capacitor circuit includes a plurality of transfer gates each coupled between a first end of a respective one of the plurality of charge storage devices and the filter input node, and wherein a second end of each of the plurality of charge storage devices is coupled to receive a respective one of the plurality of first control signals, each of the plurality of transfer gates to receive a respective one of a plurality of fourth control signals to control signal transfer through each gate.

21. The electronic system of claim 20 wherein each of the plurality of fourth control signals is a respective one of the second oscillatory signals.

22. The electronic system of claim 19 wherein the interface circuit further comprises:
   a reference clock generator; and
   a phase locked loop circuit capable of phase locking the oscillator output signal to an output of the clock generator.

23. The electronic system of claim 22 wherein the interface circuit further comprises:
   clock-data synchronizing logic having one input coupled to an output of the controllable oscillator and another input coupled to a further output of the PD which provides samples of the first oscillatory signal in response to one of the second oscillatory signals.

* * * * *

UNITED STATES PATENT AND TRADEMARK OFFICE
CERTIFICATE OF CORRECTION

PATENT NO.    : 6,249,159 B1  
DATED         : June 19, 2001  
INVENTOR(S)   : Luke A. Johnson It is certified that error appears in the above-identified patent and that said Letters Patent is hereby corrected as shown below:

Column 4,  
Line 42, delete "a CRCL_ENABLE" and insert -- an ENABLE --.  
Line 65, delete "CRC_ENABLE," and insert -- ENABLE --.

Column 6,  
Line 21, delete "following" and insert -- Following --.

Signed and Sealed this

Tenth Day of September, 2002

*Attest:*

*Attesting Officer*

JAMES E. ROGAN  
*Director of the United States Patent and Trademark Office*